United States Patent
Lewis et al.

(10) Patent No.: US 7,030,652 B1
(45) Date of Patent: Apr. 18, 2006

(54) LUT-BASED LOGIC ELEMENT WITH SUPPORT FOR SHANNON DECOMPOSITION AND ASSOCIATED METHOD

(75) Inventors: David Lewis, Toronto (CA); James Schleicher, Los Gatos, CA (US)

(73) Assignee: Altera Corporation, San Jose, CA (US)

( * ) Notice: Subject to any disclaimer, the term of this patent is extended or adjusted under 35 U.S.C. 154(b) by 61 days.

(21) Appl. No.: 10/830,819

(22) Filed: Apr. 23, 2004

(51) Int. Cl.
H03K 19/177 (2006.01)

(52) U.S. Cl. .......................... 326/41; 326/47
(58) Field of Classification Search ............. 326/41
See application file for complete search history.

(56) References Cited

U.S. PATENT DOCUMENTS

| | | | |
|---|---|---|---|
| 4,706,216 A | 11/1987 | Carter | |
| 4,758,985 A | 7/1988 | Carter | |
| 5,260,610 A | 11/1993 | Pedersen et al. | |
| 5,331,226 A | 7/1994 | Goetting | |
| 5,352,940 A | 10/1994 | Watson | |
| 5,399,922 A | 3/1995 | Kiani et al. | |
| 5,438,295 A | 8/1995 | Reddy et al. | |
| 5,488,316 A | 1/1996 | Freeman et al. | |
| 5,689,195 A | 11/1997 | Cliff et al. | |
| 5,815,003 A * | 9/1998 | Pedersen | 326/39 |
| 5,821,773 A | 10/1998 | Norman et al. | |
| 5,831,448 A | 11/1998 | Kean | |
| 5,835,998 A | 11/1998 | Pedersen | |
| 5,920,202 A | 7/1999 | Young et al. | |
| 5,923,185 A | 7/1999 | Zhou | |
| 5,953,537 A | 9/1999 | Balicki et al. | |
| 5,999,015 A | 12/1999 | Cliff et al. | |
| 5,999,016 A | 12/1999 | McClintock et al. | |
| 6,020,756 A | 2/2000 | New | |
| 6,034,540 A | 3/2000 | Mendel | |
| 6,051,992 A | 4/2000 | Young et al. | |
| 6,066,960 A | 5/2000 | Pedersen | |
| 6,069,487 A | 5/2000 | Lane et al. | |
| 6,084,427 A | 7/2000 | Lee et al. | |
| 6,107,822 A | 8/2000 | Mendel et al. | |
| 6,118,300 A | 9/2000 | Wittig et al. | |
| 6,122,720 A | 9/2000 | Cliff | |
| 6,124,731 A | 9/2000 | Young et al. | |
| 6,167,558 A | 12/2000 | Trimberger | |
| 6,184,707 B1 | 2/2001 | Norman et al. | |
| 6,191,610 B1 | 2/2001 | Wittig et al. | |
| 6,201,410 B1 | 3/2001 | New et al. | |

(Continued)

OTHER PUBLICATIONS

U.S. Appl. No. 10/280,723, filed Oct. 24, 2002, Lewis et al.

(Continued)

Primary Examiner—James H. Cho
(74) Attorney, Agent, or Firm—Beyer Weaver & Thomas, LLP

(57) ABSTRACT

A logic circuit comprising: a plurality of logic elements; wherein at least one logic element includes, first and second LUT blocks that includes an output; an output multiplexer that includes first and second inputs, an output, and that includes a control output; a control input multiplexer circuit including a control input and including first and second data inputs that can be configured to receive first and second data outputs provided by one or more other logic elements of the plurality of logic elements and that includes a data output that can be connected to the control input of the output multiplexer; and multiple control inputs that can be shared by the first and second LUT blocks.

19 Claims, 13 Drawing Sheets

U.S. PATENT DOCUMENTS

| | | |
|---|---|---|
| 6,211,696 B1 | 4/2001 | Skahill et al. |
| 6,249,149 B1 | 6/2001 | Pedersen |
| 6,255,846 B1 | 7/2001 | Lee et al. |
| 6,271,680 B1 | 8/2001 | Mendel et al. |
| 6,275,065 B1 | 8/2001 | Mendel |
| 6,323,677 B1 | 11/2001 | Lane et al. |
| 6,323,680 B1 * | 11/2001 | Pedersen et al. .............. 326/41 |
| 6,323,682 B1 | 11/2001 | Bauer et al. |
| 6,362,648 B1 | 3/2002 | New et al. |
| 6,400,180 B1 | 6/2002 | Wittig et al. |

OTHER PUBLICATIONS

U.S. Appl. No. 10/364,310, filed Feb. 10, 2003, Lewis et al.

* cited by examiner

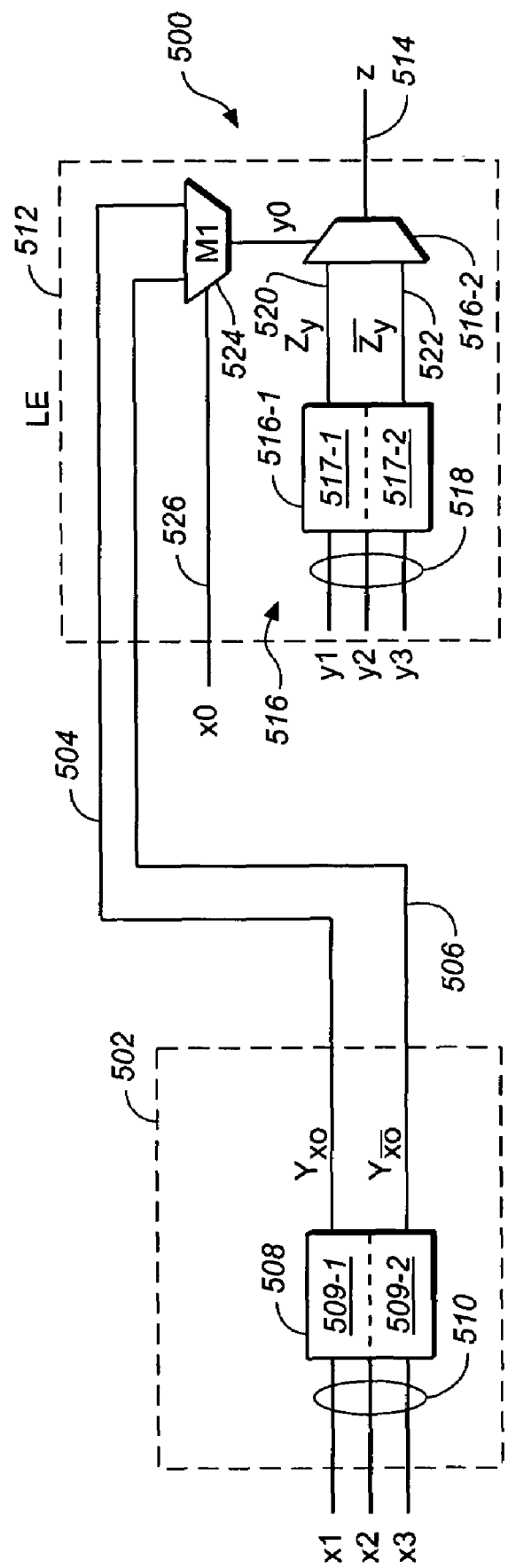
FIG._5

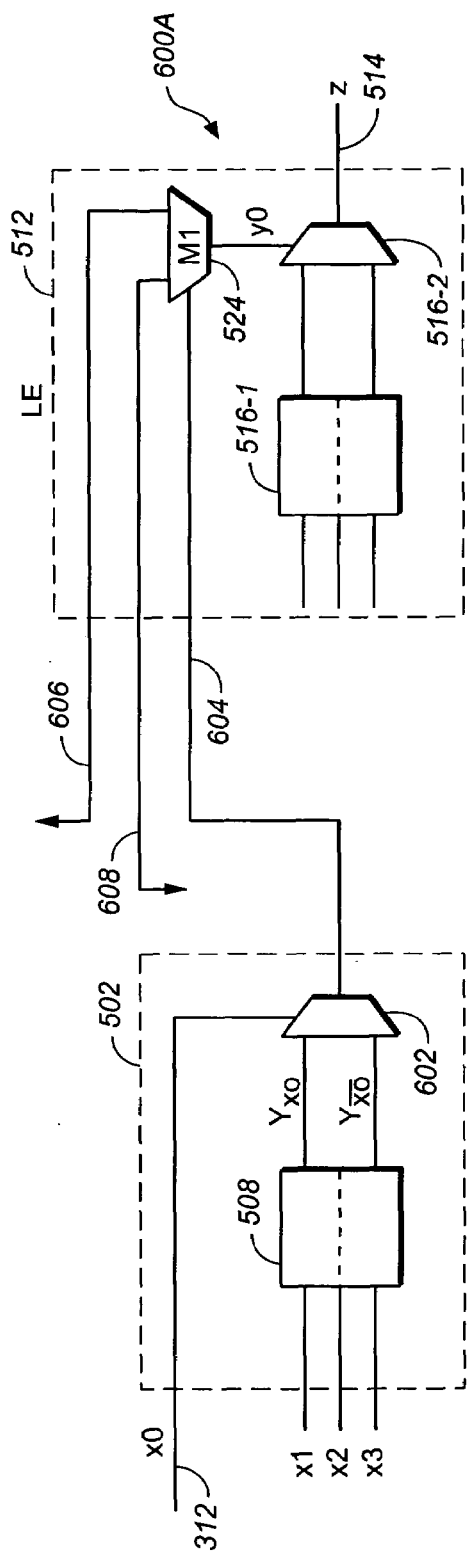
FIG._6A
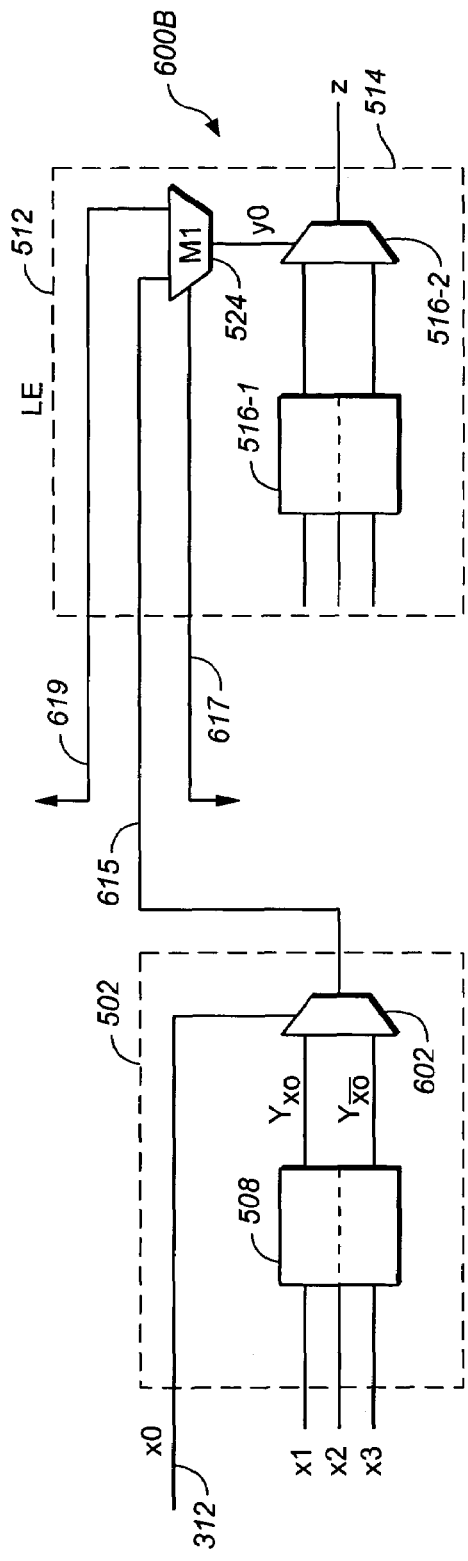
FIG._6B

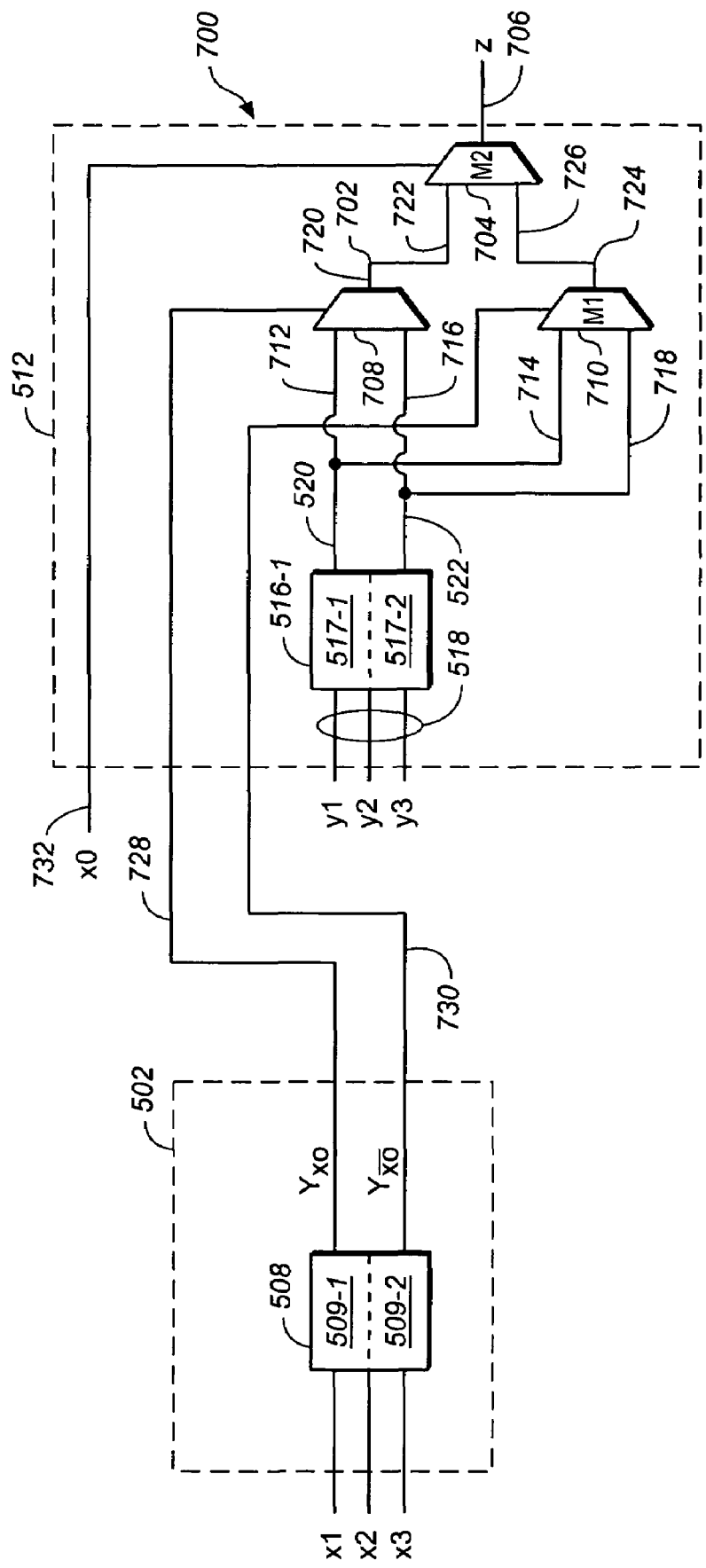
FIG._7

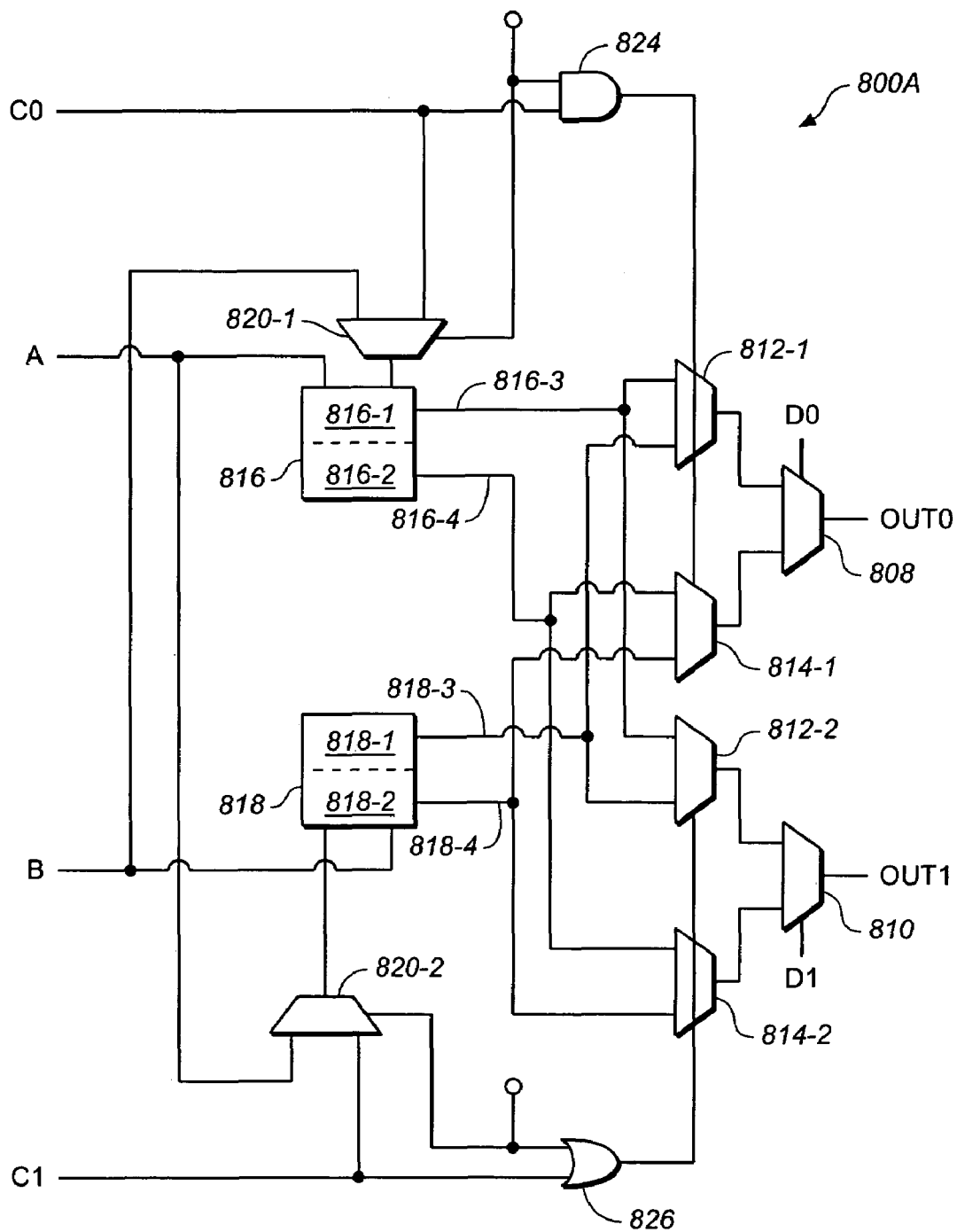
FIG._8A

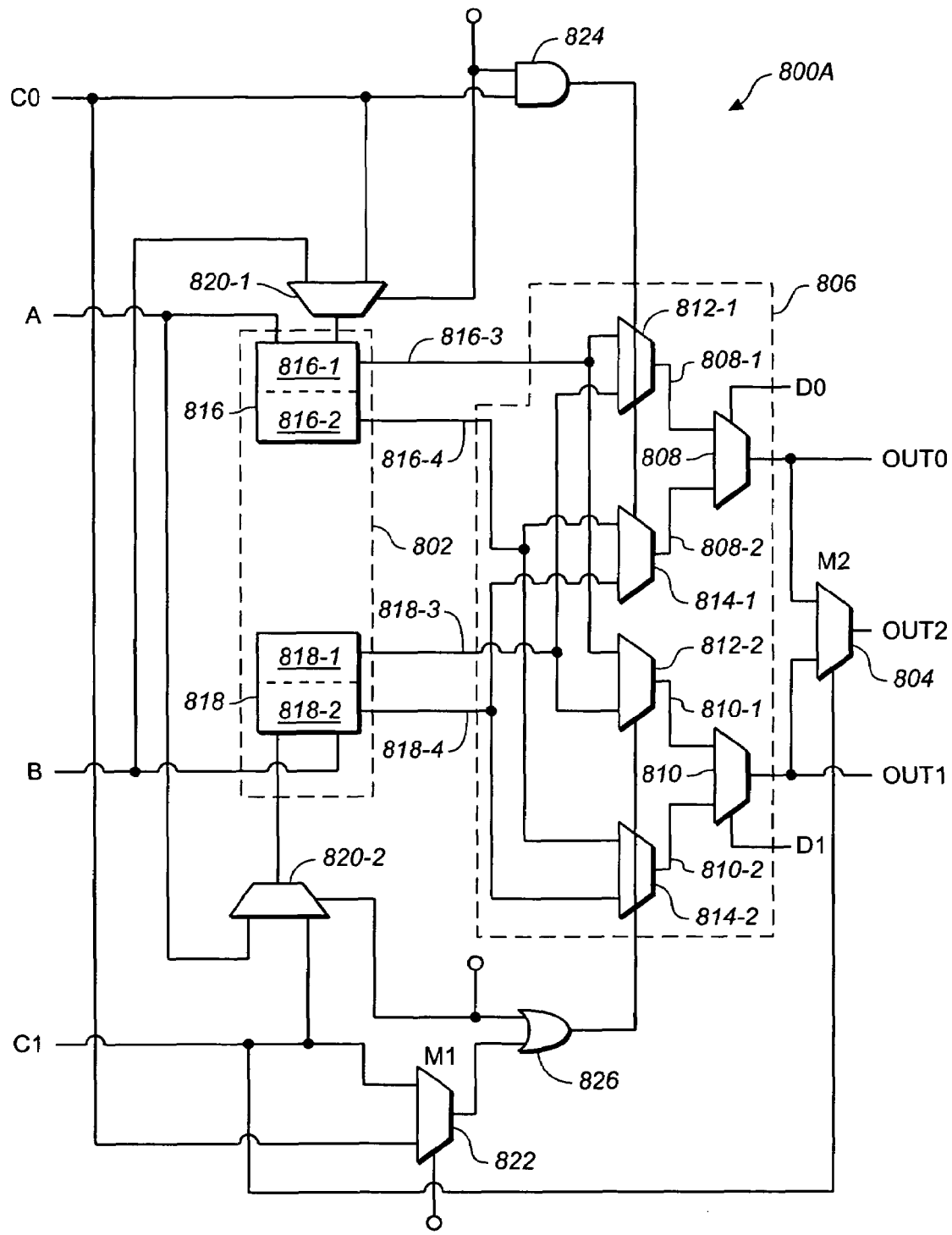
FIG._8B

FIG._9A
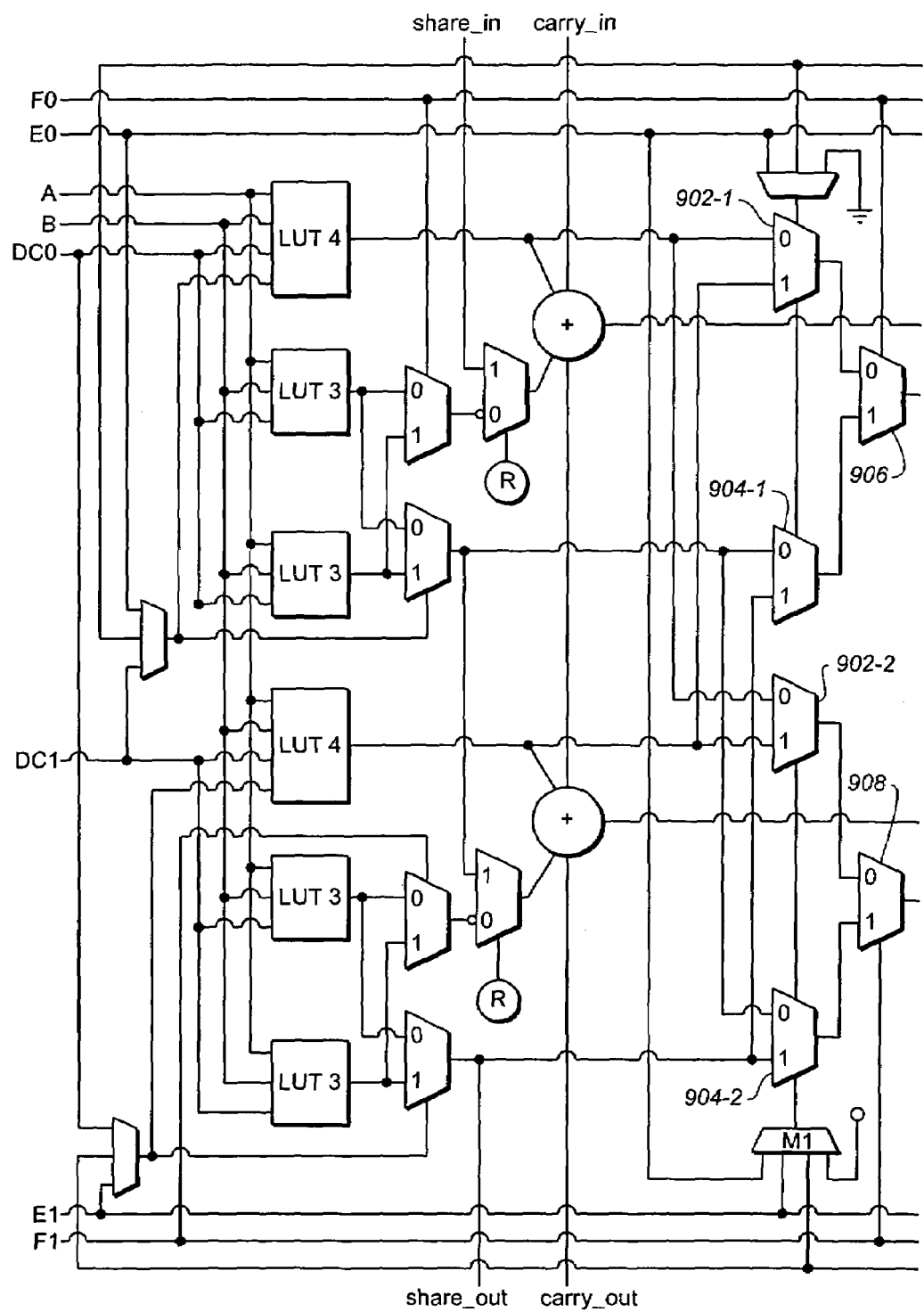

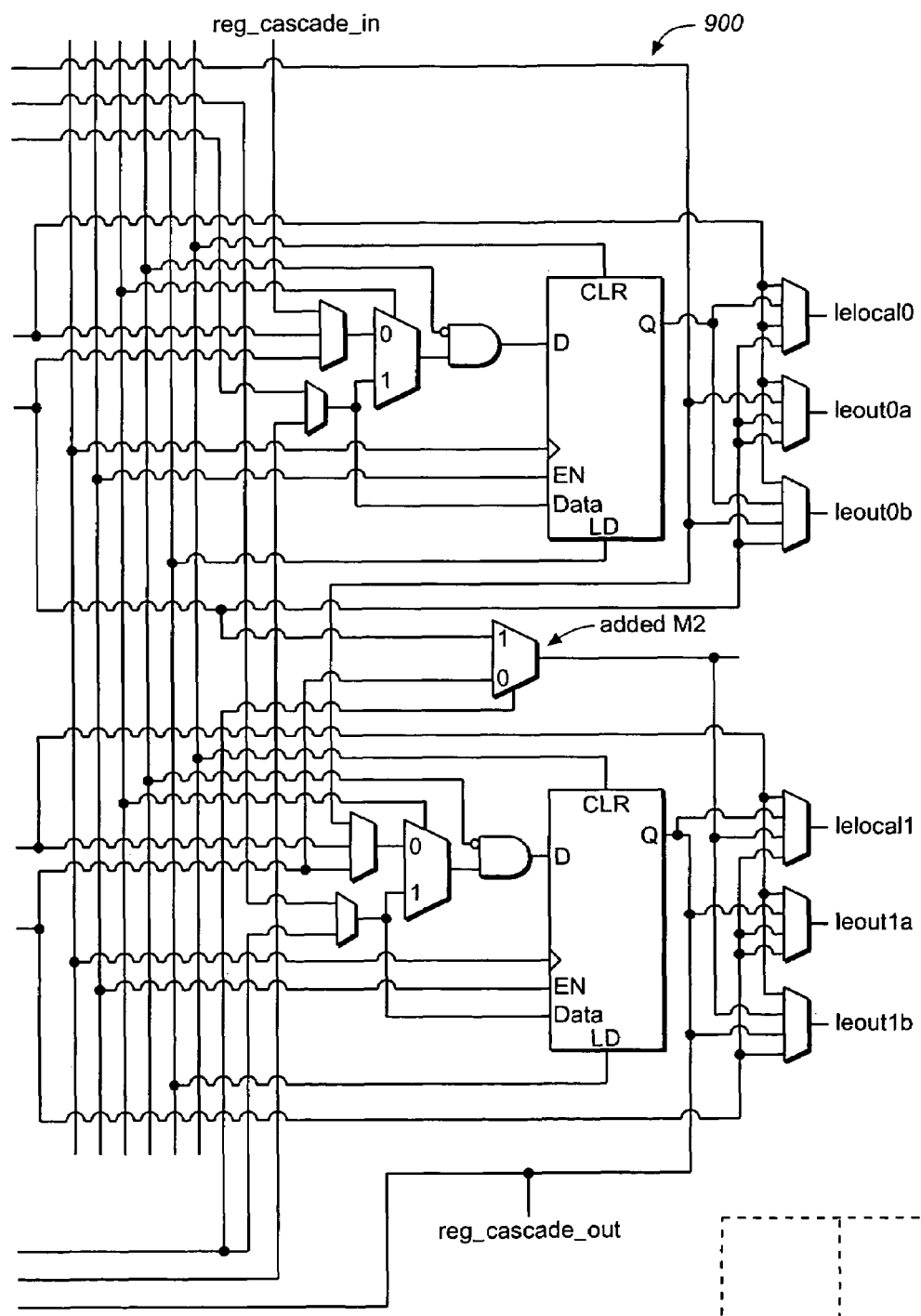
FIG._9B
FIG._9

FIG._10A
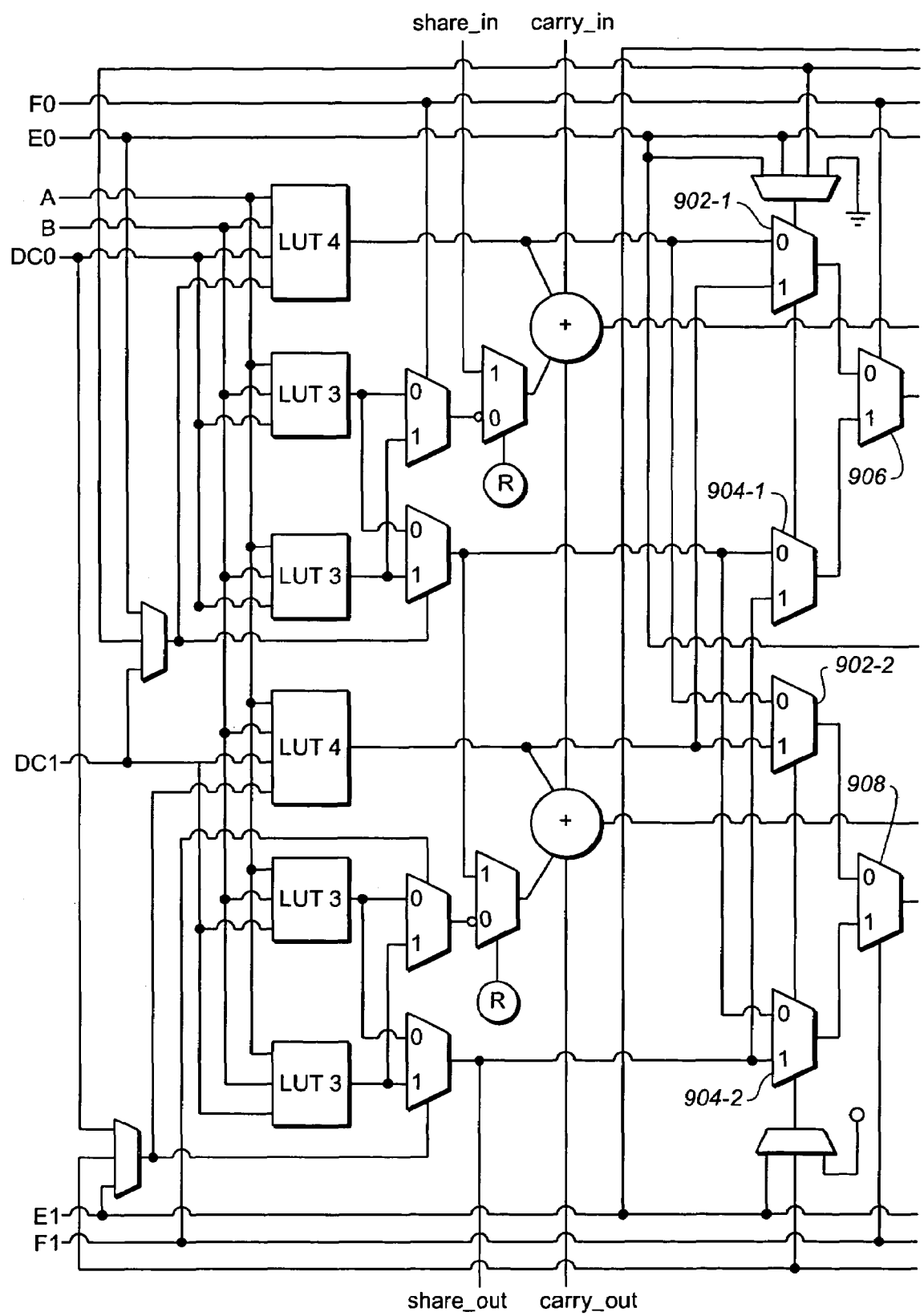

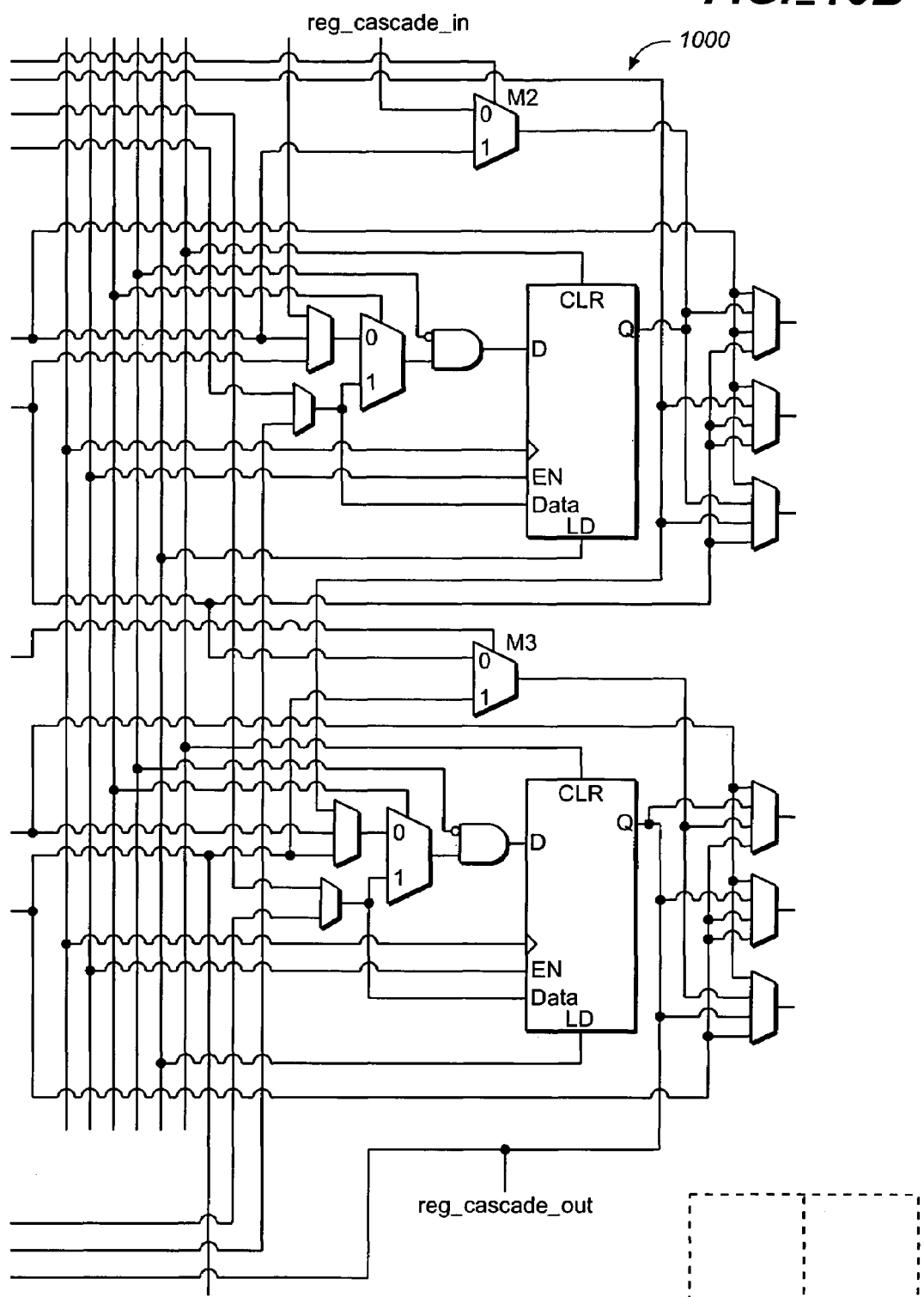
FIG._10B
FIG._10

LUT-BASED LOGIC ELEMENT WITH SUPPORT FOR SHANNON DECOMPOSITION AND ASSOCIATED METHOD

BACKGROUND OF THE INVENTION

1. Field of the Invention

The present invention relates to logic elements for use with programmable logic devices or other similar devices.

2. Description of the Related Art

Programmable logic devices ("PLDs") (also sometimes referred to as CPLDs, PALs, PLAs, FPLAs, EPLDs, EEPLDs, LCAs, FPGAs, or by other names), are well-known integrated circuits that provide the advantages of fixed integrated circuits with the flexibility of custom integrated circuits. Such devices are well known in the art and typically provide an "off the shelf" device having at least a portion that can be electrically programmed to meet a user's specific needs. Application specific integrated circuits ("ASICs") have traditionally been fixed integrated circuits, however, it is possible to provide an ASIC that has a portion or portions that are programmable; thus, it is possible for an integrated circuit device to have qualities of both an ASIC and a PLD. The term PLD as used herein will be considered broad enough to include such devices.

PLDs typically include blocks of logic elements, sometimes referred to as logic array blocks ("LABs"; also referred to by other names, e.g., "configurable logic blocks," or "CLBs"). Logic elements ("LEs", also referred to by other names, e.g., "logic cells") may include a look-up table (LUT) or product term, carry-out chain, register, and other elements.

Logic elements, including look-up table (LUT)-based logic elements, typically include configurable elements holding configuration data that determines the particular function or functions carried out by the logic element. A typical LUT circuit may include configuration RAM bits that hold data (a "1" or "0"). However, other types of configurable elements may be used. Some examples may include static or dynamic random access memory, electrically erasable read-only memory, flash, fuse, and anti-fuse programmable connections. The programming of configuration elements could also be implemented through mask programming during fabrication of the device. While mask programming may have disadvantages relative to some of the field programmable options already listed, it may be useful in certain high volume applications. For purposes herein, the generic term "memory element" will be used to refer to any programmable element that may be configured to determine functions implemented by a PLD.

PLDs are commonly constructed using a lookup table (LUT) as the basic logic element. A typical LUT circuit used as a logic element provides an output signal that is a function of multiple input signals. For example, a K-input lookup table (K-LUT) typically includes $2^K$ programmable memory elements, and a $2^K$ to 1 multiplexer, selecting one of the storage elements under the control of the K select (control) inputs to the multiplexer. These K inputs can be considered to be the control inputs to a K-input logic function which can implement any particular required logic function by setting the contents of the memory elements to the appropriate values.

A typical LUT circuit may be represented as a plurality of memory elements coupled to a "tree" of muxes. A typical LUT mux tree includes a first level comprising a single 2:1 mux providing the LUT output and also includes successive additional levels of muxes, each level including twice as many muxes as the previous level and the number of memory elements being twice as many as the number of 2:1 muxes in a last mux level coupled to the memory elements.

FIG. 1 is an illustrative block diagram of logic circuitry 100 that implements the function f(x0,x1,x2,x3). In this example, the value of the function f depends upon a combination of values of inputs x0, x1, x2, and x3. A LUT of a logic element of a PLD may be programmed to serve as the logic circuitry 100 that implements the function f. A signal timing issue may arise if the value of one of the inputs arrives at, or becomes valid at its logic circuit input, significantly later than the values of the other inputs. The circuit path that delivers such later-arriving input signal value is commonly referred to as a critical path. Critical path delay is an important factor in determining overall delay in producing a value of f based upon values for x0, x1, x2, and x3.

Shannon decomposition is a well known technique for reducing the impact of critical path delay upon the speed of operation of a logic circuit. Shannon decomposition is stated as the mathematical theorem:

$$f(x0,x1,\ldots) = \overline{x0} \cdot f(0,x1,\ldots) | x0 \cdot f(1,x1,\ldots)$$

For notational brevity, f(0,x1, . . . ) is denoted $f_{\overline{x0}}$ and f(1,x1, . . . ) is denoted $f_{x0}$ and are respectively referred to as the $\overline{x0}$ and x0 co-factors off.

FIG. 2 is an illustrative block diagram of a circuit 200 to provide a Shannon decomposition of function f(x0,x2,x2,x3) where value x0 is a critical path signal. A first logic circuitry 202 receives as inputs, 0, x1, x2, and x3, and provides as an output, the value for $f_{\overline{x0}}$. A second logic circuitry 204 receives as inputs, 1, x1, x2 and x3 and provides as an output, the value for $f_{x_0}$. A multiplexer 206 receives $f_{\overline{x0}}$ and $f_{x_0}$ as data values; receives x0 as a control input value; and provides f as an output value. Delay in the determination of f due to late arrival of critical path value x0 is reduced by pre-computing a value off assuming x0=0 using first circuitry 202 and by also pre-computing a value of f assuming x0=1 using second circuitry 204. In this example, the delay from a time that x0 is valid until a time that the output off is valid is no more than approximately the delay of the multiplexer.

One or more LUTs of one or more LEs may be programmed to serve as the first and second logic circuitry 202, 204 and multiplexer 206 that implement the Shannon decomposition of the function f in FIG. 2. The Shannon decomposition technique of FIG. 2 is of limited use in LUT-based LEs because a LUT is a tree of multiplexers, and a LUT essentially provides a Shannon decomposition of a single stage of the logic.

FIG. 3 is an illustrative drawing of a logic network 300 that implements a logic circuit using two levels of LUTs. The network 300 includes first and second LUTs 302, 304. In this example, a critical path extends from the path of signal x to the path of signal y to the path of signal z. Each LUT 302, 304 may be a constituent of a different LE in a single PLD, for example. The first LUT 302 includes a first pair of LUTs indicated by block 302-1. Multiplexer 302-2 is the first-level multiplexer of the first multiplexer tree of the first LUT 302. The second LUT 304 includes a second pair of LUTs indicated by block 304-1 and multiplexer 304-2. Multiplexer 304-2 is the first-level multiplexer of the second multiplexer tree of the second LUT 302. The first LUT 302 is connected to receive three first control inputs 310 to LUTs 302-1 and is connected to receive signal x as a control input 312 to first-level multiplexer 302-2. LUTs 302-1 are connected to provide outputs $y_{x0}$ and $y_{\overline{x0}}$ as inputs to the first-level multiplexer 302-2. The first-level multiplexer 302-2 provides a value of signal y as an output. The second LUT 304 is connected to receive three second control inputs 314 to LUTs 304-1 and is connected to receive signal y as a control input 316 to first-level multiplexer 304-2. Multiplexer block 304-1 is connected to provide outputs $z_{y0}$ and $z_{\overline{y0}}$ as inputs to first-level multiplexer 302-2. The first-level multiplexer 304-1 provides a value of signal z as an output on line 318.

Signal y output from first LUT 302 is used as input y0 to second LUT 300. Thus y and y0 refer to the same logic signal. Also, signal x is used as input x0 to first LUT 302 so x and x0 refer to the same logic signal. A signal will generally be referred to without the appended digit when used in the context of an output from a logic element, i.e. y is an output of an LE, but referred to with the appended digit when used as input to another logic element, i.e. y0 is an input to another logic element.

In the network 300 of FIG. 3, the value of y depends upon the value of x, and the value of z depends upon the value of y. Although each of signals y and z are implemented with LUTs that naturally form the Shannon decomposition of critical input signals x0 and y0 respectively, the complete circuit still has significant delay, associated with the propagation of signal x through first-level multiplexer 302-2 and may incur delay associated with the propagation of signal y along path 316.

Thus, there is a need for improved LUT based circuits that can achieve Shannon decomposition. The present invention meets this need.

SUMMARY OF THE INVENTION

One aspect of the invention provides a first logic circuit with a plurality of logic elements. At least one of the logic elements includes first and second LUT blocks with respective first and second outputs. An output multiplexer is provided that includes first and second data inputs a data output and a control input. A control input multiplexer circuit provides a control input and first and second data inputs that can be configured to receive first and second data outputs provided by one or more other logic elements of the logic circuit. The control input multiplexer also includes a data output that can be connected to the control input of the output multiplexer. Multiple control inputs that can be shared by the first and second LUT blocks.

The first logic circuit can be programmed to efficiently implement a Shannon decomposition. More particularly in an associated method aspect of the invention, a critical path signal x can be provided to the control input of the output multiplexer. Respective x-co-factors of a control signal y can be provided as respective data inputs to the control input multiplexer circuit. Non-critical path dependent control signals can be provided to the multiple respective control inputs. The first and second LUT blocks can be programmed to provide respective y-co-factors of an output signal z in response to provision of the non-critical path control signals.

Another aspect of the invention provides a second logic circuit that includes first and second LUT blocks with first and second outputs. An output multiplexer is provided that includes first and second inputs and first and second outputs and a control input. A first interposed multiplexer is provided that can be coupled to receive a signal output by the respective first and second outputs of the first and second LUT blocks and that includes a first intermediate multiplexer output that can be coupled to the first input of the output multiplexer and that includes a control input; A second interposed multiplexer is provided that can be coupled to receive a signal output by the respective first and second outputs of the first and second LUT blocks and that includes a second intermediate multiplexer output that can be coupled to the second input of the output multiplexer and that includes a control input. Respective control inputs are provided that can be shared by the first and second LUT blocks.

The second logic circuit can be programmed to efficiently implement a Shannon decomposition. More particularly in another associated method aspect of the invention, a critical path signal x is provided to the control input of the output multiplexer. Respective x-co-factors of control signal y are provided to respective control inputs of the first and second interposed multiplexers. Respective non-critical path dependent control signals are provided to the respective control inputs. The first and second LUT blocks are programmed to provide respective y-co-factors of an output signal z on the respective first and second LUT block outputs in response to provision of the respective non-critical path control signals.

These and other features and advantages of the invention will be appreciated from the following detailed description of preferred embodiments in conjunction with the appended drawings.

BRIEF DESCRIPTION OF THE DRAWINGS

FIG. 5 is an illustrative drawing of a logic circuit for performing a Shannon decomposition in accordance with an embodiment of the invention.

FIGS. 6A–6B are illustrative drawings of logic circuitry similar to that of FIG. 5, but connected differently so as to operate in a normal or non-Shannon mode.

FIG. 7 is an illustrative drawing of a logic circuit for performing a Shannon decomposition in accordance with an embodiment of the invention.

FIGS. 8A–8B are illustrative drawings of shared LUT Mask (SLM) logic circuits. FIG. 8A is a prior SLM logic circuit and FIG. 8B is logic circuit with shared lookup table configured to permit Shannon decomposition in accordance with an embodiment of the invention.

FIG. 9 is a more detailed illustrative drawing of a logic element, which includes components that can be used to implement a Shannon decomposition mode of operation.

FIG. 10 is an illustrative drawing of a slightly modified version of the logic element of FIG. 9.

DETAILED DESCRIPTION OF EXEMPLARY EMBODIMENTS

The present invention provides a novel logic circuit and method of providing a Shannon decomposition. The following description is presented to enable any person skilled in the art to make and use the invention. The embodiments of the invention are described in the context of particular applications and their requirements. These descriptions of specific applications are provided only as examples. Various modifications to the preferred embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 4B:
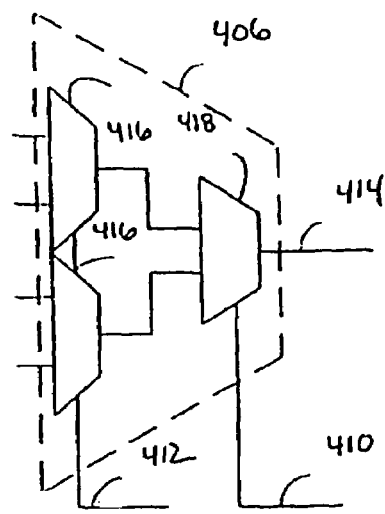
FIGS. 4A–4B are illustrative drawings of a 4-LUT, which includes both memory elements and 4:1 multiplexers, and a "tree" of 2:1 multiplexers that make up the one of the 4:1 multiplexers.
Figure 4A:
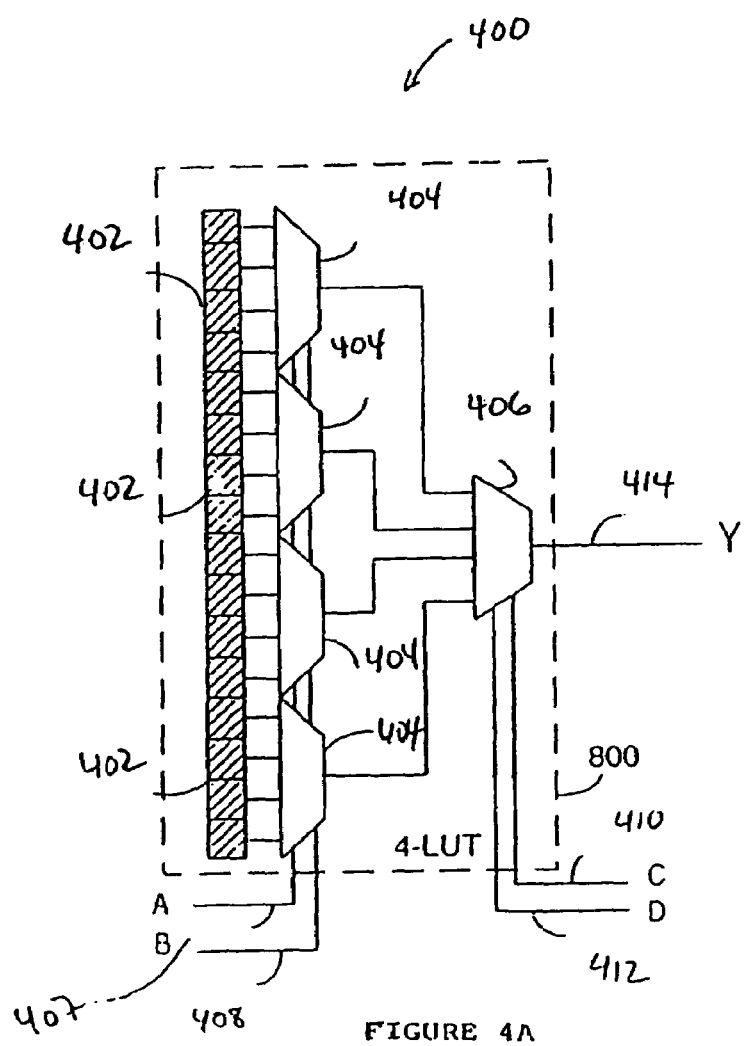

FIG. 4A shows a 4-LUT 400, which includes memory elements 402, and 4:1 multiplexers 404, 406. Each memory element 402 can hold one data bit (i.e., 1 or 0) and each is coupled to provide that bit to an input of a multiplexer 404 as shown. Two control inputs of each multiplexer 404 are coupled to, respectively, an input A 407 and an input B 408 of the 4-LUT 400. The output of each of these multiplexers 404 is coupled to an input of a 4:1 multiplexer 406 as shown. Two control inputs of this multiplexer 406 are coupled, respectively, to an input C 410 and an input D 412 of the 4-LUT 400. The output of this multiplexer 406 provides the final output Y 414 of the 4-LUT 400.

Those skilled in the art will appreciate that a 4-LUT such as the 4-LUT 400 of FIG. 4A can provide a complete function of four input signals. "Complete" in this context simply means that the memory elements 402 can be programmed to configure the 4-LUT 400 to perform any four-input function. That is, the 4-LUT 400 can be configured by programming its memory elements (e.g., loading values into those elements) so that the output signal Y 414 is any one of a full range of logical functions of the input signals A 407, B 408, C 410 and D 412 as will be appreciated by those skilled in the art.

FIG. 4B illustrates a "tree" of 2:1 multiplexers 416, 418 that make up the final 4:1 multiplexer 406 of FIG. 4A. (The other 4:1 multiplexers 404 can be similarly characterized.) Control inputs 410, 412 of the multiplexers 418, 416 correspond to inputs of the 4-LUT 400. An output at a higher level of multiplexers 416 (i.e., closer to the memory elements 402) feeds into the next level 418 closer to the output 414. As will be appreciated by those skilled in the art, one can consider the "tree" of the 2:1 multiplexers 416, 418 making up the final 4:1 multiplexer 406 as part of a larger 2:1 multiplexer tree that characterizes the 4-LUT 400. More generally, a typical LUT circuit has a multiplexer tree that may be referenced by "levels" of 2:1 multiplexers provided relative to the LUT circuit's output.

For example, the multiplexer 418 closest to the output 414 may be called a first level of multiplexers in the overall 2:1 multiplexer tree of the 4-LUT 400 and the next set of two multiplexers 416 may be called a second level in that tree. By extending the structure of FIG. 4B to FIG. 4A, there are four levels of 2:1 multiplexers in the 4-LUT 400. The 4-LUT 400 has a third level that includes four 2:1 multiplexers (i.e., one for each multiplexer 404) with control inputs coupled to logic input B 408, and a fourth level that includes eight 2:1 multiplexers (i.e., two for each multiplexer 404) with control inputs coupled to logic input A 407.

As will be appreciated by those skilled in the art, a 4:1 multiplexer may be implemented in a manner other than the illustrated multiplexer 406, which has a "tree" of three 2:1 multiplexers 418, 416 at two distinct levels. For example, a 4:1 multiplexer might be implemented by four pass gates with each of the pass gates being controlled by the decoded output of two control signals. In such an example, the four pass gates themselves would not be differentiated by levels relative to each other, however, the 4:1 multiplexer would effectively implement two levels of 2:1 multiplexing.

FIG. 5 is an illustrative drawing of a logic circuit 500 that can be used to perform a Shannon decomposition in accordance with one embodiment of the invention. It can be seen that logic circuit 500 is logically identical to logic circuit 300, and therefore the functionality provided is identical. Logic circuit 500 can be thought of as moving multiplexer 302-1 from the first logic element into the second, requiring the addition of a multiplexer 524 to logic element 500, as well as two additional inputs to the logic element, and providing the ability to generate two outputs from logic element 502. These modifications are responsible for the speed improvement of logic circuit 500 compared to logic circuit 300.

The logic circuit 500 includes a first circuit 502 that provides as outputs on lines 504, 506, x0 cofactors of y, $y_{x0}$ and $y_{\overline{x0}}$. The first logic circuit 502 may be implemented as an LE with LUT circuitry 508 that receives multiple inputs x1, x2, and x3 on lines 510 and that produces values $y_{x0}$ and $y_{\overline{x0}}$ on lines 504, 506. The value y is a function f of (x0, x1, x2, x3). Output $y_{x0}$ is the value of y if x0=1 (i.e., $y_{x0}$=f (x0=1,x1,x2,x3)). Output $y_{\overline{x0}}$ is the value of y if x0=0, (i.e., $y_{\overline{x0}}$=f(x0=0,x1,x2,x3)).

The logic circuit 500 also includes a second circuit 512 that provides as an output on line 514, the value of z. The second logic circuit is implemented as an LE with LUT circuitry 516 that includes a pair of LUTs indicated as 516-1 and first-level multiplexer 516-2. The LUTs 516-1 are connected to receive multiple control inputs (y1, y2, y3) on lines 518 and to provide as outputs, y0 cofactors of z, $z_{y0}$ and $z_{\overline{y0}}$ on lines 520, 522. The value of z is a function g(y0,y1, y2,y3). Output $z_{y0}$ is the value of z if y0=1 (i.e., $z_{y0}$=g(y0=1, y1,y2,y3)). Output $z_{\overline{y0}}$ is the value of z if y0=0, (i.e., $z_{\overline{y0}}$=g(y0=0,y1,y2,y3). The second circuit includes a control signal selection multiplexer 524 connected to receive as data inputs the x0 cofactors of y, $y_{x0}$ and $y_{\overline{x0}}$ on lines 504, 506, to receive value x0 as a control input on line 526 and to output a selected value for y as a control input to first-level multiplexer 516-2.

It will be understood that signal values $y_{x0}$ and $y_{\overline{x0}}$ represent both x0 co-factors of a first critical path signal dependent signal y0. Moreover, signal values $z_{y0}$ and $z_{\overline{y0}}$ represent both co-factors of a second critical path signal dependent signal z which in turn depends upon the value of critical path signal x0.

In one embodiment, LUT circuitry 508 and LUT circuitry 516 are implemented using respective 4-input LUTs. Basically, a 4-input LUT is implemented as a pair of 3-input LUTs controlled by common control inputs in combination with a 2:1 multiplexer to form a first-level multiplexer stage. Specifically, LUT block 516-1 includes a first 3-input LUT 517-1 and a second 3-input LUT 517-2 that share three non-critical path inputs (y1, y2, y3) on lines 518. The memory elements (not shown) of LUT block 516-1 are programmed so that the first 3-input LUT 517-1 provides value $z_{y0}$ on line 520 in response to inputs (y1, y2, y3) and so that the second 3-input LUT 517-2 provides value $z_{\overline{y0}}$ on line 522 in response to inputs (y1, y2, y3). The first-level multiplexer 516-2 receives as its data inputs, the respective outputs of the first and second 3-input LUTs 517-1, 517-2. It will be appreciated that the number of non-critical path input values, whether shared or not, is not important to the invention, and that the invention can be practiced with fewer or more than three non-critical path input values.

Similarly, LUT circuitry 508 includes a first 3-input LUT 509-1 and a second 3-input LUT 509-2 that share three inputs 510. The memory elements (not shown) of LUT circuitry 508 are programmed so that the first 3-input LUT 509-1 provides value $y_{x0}$ on line 504 in response to non-critical path inputs (x1, x2, x3); and so that the second 3-input LUT 509-2 provides value $y_{\overline{x0}}$ on line 506 in response to inputs (x1, x2, x3). A first-level multiplexer is present in the 4-input LUT circuitry 508, but it is not shown so as to simplify the drawing. Again, the number of non-critical path input values is not important to the invention.

Thus, in one embodiment, the logic circuit 500 effects a Shannon decomposition in which respective cofactor values $y_{x0}$ and $y_{\overline{x0}}$ are pre-computed by respective 3-input LUTs 509-1, 509-2 of the first circuit 502. The value of y0 depends upon the value of critical path signal x0. Respective values of cofactors $y_{x0}$ and $y_{\overline{x0}}$ are conducted to the second logic circuit 512, which computes values $z_{y0}$ and $z_{\overline{y0}}$. Respective values of cofactors $z_{y0}$ and $z_{\overline{y0}}$ are computed by respective 3-input LUTs 517-1, 517-2 of the second circuit 512. The value of z depends upon the value of y0. The control signal selection multiplexer 524 of the second circuit 512 selects between values $y_{x0}$ and $y_{\overline{x0}}$ based upon the value of x0, which is a critical path value. The first-level multiplexer 516-2 of the second circuit 512 selects between $z_{y0}$ and $z_{\overline{y0}}$ based upon the value of y0.

Figure 1:
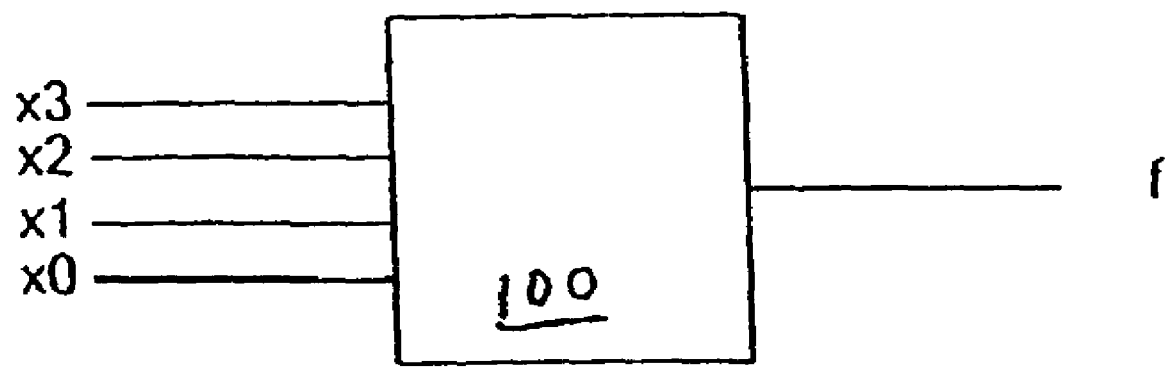
FIG. 1 is an illustrative block diagram of a logic stage in an integrated circuit programmed to implement the function f(x0,x1,x2,x3).
Figure 2:
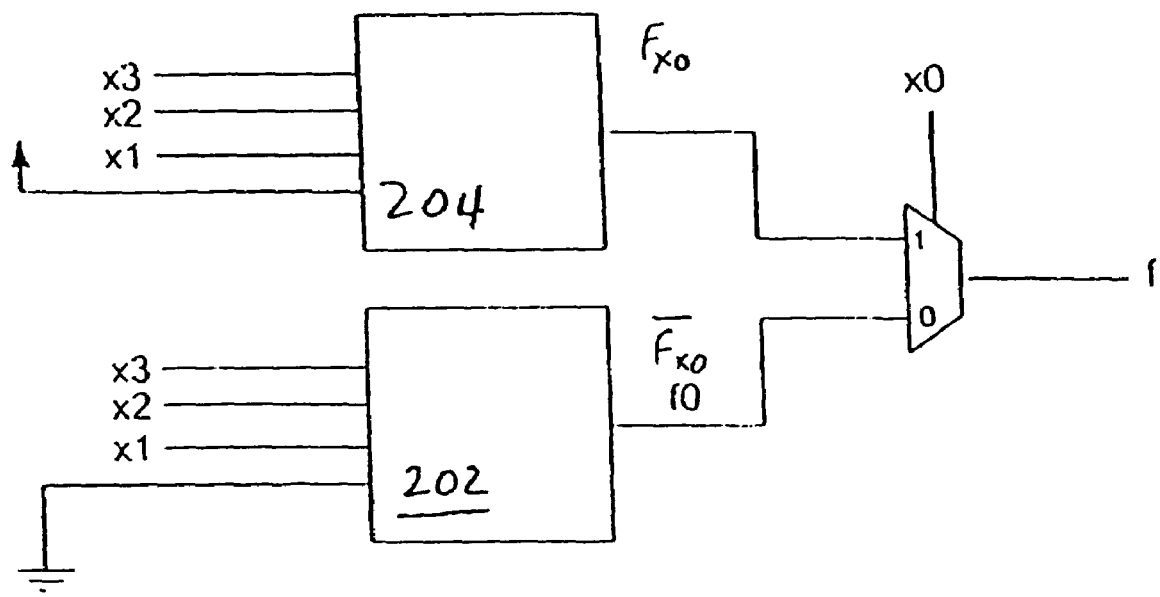
FIG. 2 is an illustrative block diagram of a circuit to provide a Shannon decomposition of function f, of FIG. 1, where value is a critical path value.
Figure 3:
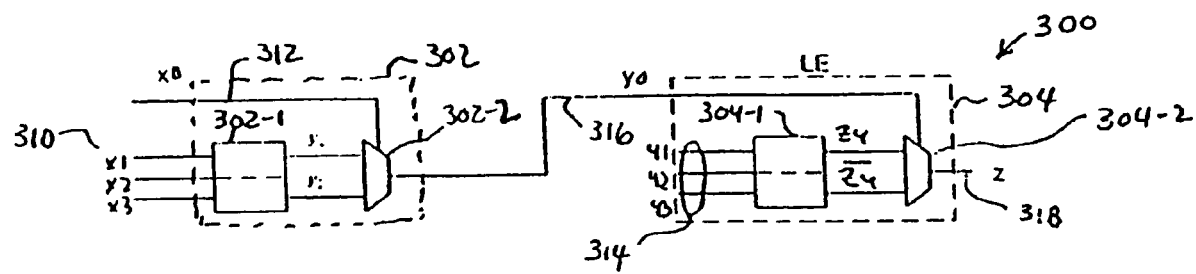
FIG. 3 shows illustrative block diagram of a Shannon decomposition constructed using first and second LUTs in which a critical path extends from path x to path y to path z.

The circuitry and Shannon decomposition method described with respect to FIG. 5 provides an improvement, since alternative values of signal y0 are pre-computed by the first circuit 502 and are conducted immediately to the second circuit 512. Unlike a circuit such as that of FIG. 3, for example, there is no need to await an actual value of critical path signal x0 in order to conduct an actual value of signal y0 to a downstream circuit. Rather, in the embodiment of FIG. 5, both critical path signal x0 cofactors of signal y0 are pre-computed and a selection between those alternate values is made using control input selection multiplexer 524 within the second circuit 512, upon the arrival of critical path value x0. Both the computation of y and z are performed in a single logic element, hence the path used by signal x0 only goes through a single logic elements, eliminating the routing delay associated with the wires between logic element 302 and 304 of FIG. 3.

It will be appreciated that additional components, such as multiplex circuitry (not shown) may be provided to permit control inputs to be programmably connected so that they are not shared in a non-Shannon decomposition mode, for instance. For example, additional multiplex circuitry (not shown) may be included to permit the first and second LUT circuitry 508, 516 to be connected to one or more non-shared control signals.

FIGS. 6A–6B are illustrative drawings of alternative logic circuitry 600A and 600B similar to that of FIG. 5, but connected differently so as to operate in a normal or non-Shannon mode. Persons skilled in the art will be appreciate that in a PLD, for example, components can be connected (programmed) differently for different applications. Components of circuitry 600A and 600B that are the same as corresponding components of circuitry 500 are labeled with identical reference numerals. Referring to FIG. 6A, the value of z is dependent upon the value of y0, and the value of y0 is dependent upon the value of x0. In one embodiment, the first circuit 502 includes a 4-input LUT comprising LUT circuitry 508 connected to a first-level 2:1 multiplexer 602. A value of y0 is produced on line 604 which is connected to the control input of multiplexer 524. Data input line 606 of multiplexer 524 is connected to a logic "1" value. Data input line 608 of multiplexer 524 is connected to a logic "0" value. The value of y0, therefore, determines whether $z_{y0}$ and $z_{\overline{y0}}$ is selected as the z value provided on line 514.

Referring to FIG. 6B, signal y0 is input to one of the data inputs 615 of multiplexer 524, and the control line 617 is set to select this input, passing the value of y0 to the output. The other data input 619 is connected to some prescribed constant value.

FIG. 7 is an illustrative drawing of a logic circuit 700 for performing a Shannon decomposition in accordance with an embodiment of the invention. Components of the logic circuit of FIG. 7 that are identical to corresponding components of the logic circuit 500 of FIG. 5 are identified with identical reference numerals. In the example embodiment of FIG. 7, signal x0 is a critical path signal. Also, the value of y0 depends on the value of x0, and the value of z depends on the value of y0.

In the embodiment of FIG. 7, a second logic circuit 702 is implemented as an LUT-based LE. Just as in the embodiment of FIGS. 5–6, LUT block 516-1 includes a first 3-input LUT 517-1 and a second 3-input LUT 517-2 that share three inputs (y1, y2, y3) on lines 518. The memory elements (not shown) of LUT block 516-1 are programmed so that the first 3-input LUT 517-1 provides value $z_{y0}$ on line 520 in response to inputs (y1, y2, y3) and so that the second 3-input LUT 517-2 provides value $z_{\overline{y0}}$ on line 522 in response to inputs (y1, y2, y3). Thus, LUT block 516-1 provides both y0 cofactors for z.

A first level multiplexer 704 produces an output value z on line 706. First and second intermediate multiplexers 708, 710 are interposed between LUT circuitry 516-1 and the first level multiplexer 704. More specifically, respective first data inputs 712, 714 of the first and second interposed multiplexers 708, 710 are connected to receive signal $z_{y0}$ provided on line 520. Respective second data inputs 716, 718 of the first and second interposed multiplexers 708, 710 are connected to receive signal $z_{\overline{y0}}$ provided on line 522. An output line 720 of the first interposed multiplexer 708 is connected to a first data input line 722 of the first-level multiplexer 704. An output line 724 of the second interposed multiplexer 710 is connected to a second data input line 726 of the first-level multiplexer 704.

A control input 728 of the first interposed multiplexer 708 is connected to receive signal $y_{x0}$. A control input 730 of the second interposed multiplexer 710 is connected to receive signal $y_{\overline{x0}}$. A control input line 732 of the first-level multiplexer 704 is connected to receive signal x0.

Thus, interposed multiplexers 708 and 710 have identical data inputs, which are the y0 co-factors for z, $z_{\overline{y0}}$ and $z_{y0}$ produced by multiplexer block 516-1. The control inputs to multiplexers 708 and 710 are the x0 co-factors of y, $y_{\overline{x0}}$ and $y_{x0}$. Therefore, the multiplexers 708 and 710 produce x0 co-factors of z, $z_{\overline{x0}}$ and $z_{x0}$.

The logic circuit 700 of FIG. 7 advantageously speeds the circuit operation, as compared with circuit 500 of FIG. 5, since circuit 700 requires critical path value x0 to pass through only a single multiplexer level i.e., first-level multiplexer 704, in order to produce a value for signal z. In contrast, in the circuit 500 of FIG. 5, signal x0 passes through two levels of multiplexers, i.e., multiplexers 524 and 516-2, to produce a value for signal z.

The interposed multiplexers 708, 710 are connected between a lower level multiplexer, i.e., first-level multiplexer 704 and first and second higher level multiplexers (not shown) within LUT circuitry 516-1. The interposed multiplexers 708, 710, in effect, constitute copies of a given stage of a LUT after which they are interposed. They have duplicate data inputs, and are controlled by both co-factors of y, $y_{\overline{x0}}$ and $y_{x0}$. In other words, a first interposed multiplexer 708 receives a first copy of the intermediate outputs produced on lines 520, 522 by LUT circuitry 516-1, and a second interposed multiplexer 710 receives a second copy of the intermediate outputs produced on lines 520, 522 by LUT circuitry 516-1. This makes it possible to use different control inputs on the different interposed multiplexers 708, 710 to implement different logic functions on the copies of the inputs. Specifically, in this example, a first LUT tree comprising LUT circuitry 517-1 plus interposed multiplexer 708 receives control input $y_{x0}$ on line 728 and produces on line 720 the value of $z_{x0}$ as a function $z_{x0}=g(y0=y_{x0}, y1, y2, y3)$. A second LUT tree comprising LUT circuitry 517-2 plus interposed multiplexer 710 $y_{\overline{x0}}$ on line 730 produces on line 724 the value of $z_{\overline{x0}}$ as a function $z_{\overline{x0}}=g(y0=y_{\overline{x0}}, y1, y2, y3)$.

Basically, the first interposed multiplexer 708 is used to produce on line 720, from a first copy of intermediate outputs produced by LUT circuitry 516-1, a pre-computed possible value of $z_{x0}$ based upon an actual value of $y_{x0}$, received on control line 728. Conversely, the second interposed multiplexer 710 is used to produce on line 724, from a second copy of the intermediate outputs produced by LUT circuitry 516-1, a pre-computed possible value of $z_{\overline{x0}}$ based upon an actual value of $y_{\overline{x0}}$ received on control line 730. The first-level multiplexer 704 selects between the values on lines 720 and 724 based upon the value of critical path signal x0. Thus, Shannon decomposition is used to compute values of $z_{x0}$ and $z_{\overline{x0}}$ before an actual value of critical path signal x0 is received, thereby speeding overall operation of logic circuit 702.

In more general terms, a layer of interposed multiplexers 708, 710 are connected between a k-level multiplexer, i.e., first-level multiplexer 704 in the disclosed embodiment, and first and second k+1-level multiplexers (not shown) of LUT circuitry 517-1 and 517-2. The interposed multiplexers 708, 710 provide an additional duplicate level of multiplexers that have identical data input values and can have both cofactors of one input as control signals. Specifically, the interposed multiplexers 708, 710 receive identical data inputs and receive both y cofactors as inputs inputs $y_{x0}$ and $y_{\overline{x0}}$.

It will be appreciated that the logic circuit 700 may include additional components (not shown) that permit non-Shannon modes of operation. For example, additional programmable components may be provided to permit different connections among LUT block 516-1 and multiplexers 708, 710 and 704.

FIG. 8A is an illustrative drawing of a prior shared LUT mask (SLM) logic element 800A. This drawing is provided by way of background. This LUT can implement two functions f(A,B,C0,D0) and f(A,B,C1,D1). It can be seen that both functions must be identical, and two of the inputs must be shared (A and B) while two inputs can be distinct on each copy of the function (C0 and D0, and C1 and D1 respectively.) Alternatively, the SLM logic element may be used to implement two independent functions f(A,C0,D0) and g(B,C1,D1) by setting the CRAM to provide a 0 input to the AND gate on the top of the logic element, and a 1 input to the OR gate on the bottom of the logic element.

It be appreciated that one of the essential features of the Shannon decomposition is to provide both co-factors of some logic function, then to select between them. Therefore the SLM already provides much of the functionality required for a Shannon decomposition. The components of FIG. 8A that are identical to corresponding components of FIG. 8B described below, are labeled with identical reference numerals in both drawings. Refer to the explanation of FIG. 8B for details.

FIG. 8B is an illustrative drawing of a logic circuit 800B with a shared lookup table that can be configured to permit Shannon decomposition in accordance with an embodiment of the invention. Logic circuit 800 is an LE. Compared to prior SLM logic element 800A of FIG. 8A, logic element 800 adds two multiplexers M1 822 and M2 804. In a Shannon decomposition mode of operation, logic circuit 800 is configured to provide shared LUT circuitry 802, (indicated within dashed lines) first-level multiplexer 804 and an interposed layer of multiplexer circuitry 806 (indicated within dashed lines) connected between the LUT circuitry 802 and the first-level circuitry 804. The interposed layer of multiplexer circuitry 806 includes a first level of interposed layer of multiplexer circuitry, which includes multiplexers 808, 810 and a second level of interposed layer of multiplexer circuitry, which includes multiplexers 812-1, 814-1, 812-2, and 814-2, which are used to provide SLM functionality as well as Shannon LE functionality.

The logic circuit 800B includes control inputs A, B, C1, C0, D1 and D0. The logic circuit 800B includes outputs OUT0, OUT1 and OUT2. During Shannon decomposition mode of operation, the interposed layer of multiplexer circuitry 806 is programmed to produce duplicates of intermediate outputs produced by the shared LUT 802 as data inputs to multiplexers 808, 810. More specifically, second level interposed multiplexers 812-1, 812-2, 814-1, 814-2 are connected to route copies of shared LUT circuitry 802 outputs to data inputs of first level interposed layer multiplexers 808, 810. First level multiplexer 804 is connected to receive as respective input signals, the respective output signals of the first level interposed multiplexers 808, 810.

More specifically, in the embodiment of FIG. 8B, shared LUT multiplex circuitry 802 includes a first shared LUT block 816 and a second shared LUT block 818. The first shared LUT block 816 includes two 2-input LUT sub-blocks 816-1 and 816-2. The second shared LUT block 816 includes two 2-input LUT sub-blocks 818-1 and 818-2. Each 2-input LUT sub-block includes four memory elements and a two-level multiplexer tree that receives two control inputs and that provides one output signal. The first shared LUT block 816 provides two respective output signals 816-3 and 816-4 produced by its first and second LUT sub-blocks 816-1 and 816-2, respectively. The second shared LUT block 818 provides two respective output signals 818-3 and 818-4 produced by its first and second LUT sub-blocks 818-1 and 818-2, respectively.

The interposed multiplexer circuit 806 of the embodiment of FIG. 8B is connected between the shared LUT circuitry 802 and the first-level multiplexer 804 as follows. The respective outputs of LUT sub-blocks 816-1 and 816-2 are coupled to respective first inputs of second level interposed multiplexers 812-1 and 814-1, and 812-2 and 814-2 respectively. The respective outputs of LUT sub-blocks 818-1 and 818-2 are coupled to respective second inputs of second level interposed multiplexers 812-1 and 814-2, and 812-2 and 814-2 respectively. The outputs of second level interposed multiplexers 812-1 and 814-1 are connected to respective first and second inputs of first level interposed multiplexer 808. The outputs of second level interposed multiplexers 812-2 and 814-2 are connected to respective first and second inputs of first level interposed multiplexer 810.

During Shannon decomposition mode operation, first and second control signal multiplexers 820-1, 820-2 are configured to provide control inputs A and B to both the first shared LUT block 816 and the second shared LUT block 818. A third control signal multiplexer 822 is configured to provide on its output, control signal C0. Thus, control signal C0 is provided as an input to AND gate 824 and also is provided as an input to NOR gate 826.

An output of AND gate 824 is provided to the control inputs of second level interposed multiplexers 812-1 and 814-1. An output of OR gate 826 is provided to the control inputs of second level interposed multiplexers 812-2 and 814-2. These are required for operation as an SLM that can be configured as two smaller independent LUTs, as described above. Basically, the control inputs to second level interposed multiplexers 812-1, 814-1 and the control inputs of second level interposed multiplexers 812-2, 814-2 cause the respective first data inputs 808-1, 810-1 of the first level interposed multiplexers 808 and 810 to have one of the identical output signals of shared LUT circuitry 802 (either 816-1 or 818-1) and cause the respective second data inputs 808-2, 810-2 of the first level interposed multiplexers 808 and 810 to have the other of the identical output signals of shared LUT circuitry 802 (either 816-2 or 818-2).

During Shannon decomposition mode operation, it is assumed that signal C1 is a critical path signal. It is further assumed that D0 and D1 carry the two co-factors with respect to some signal C1. In order to harmonize the following description of the embodiment of FIG. 8B with the descriptions of the embodiments of FIGS. 5–7, signals in FIG. 8B shall be referred to in terms analogous to those used to describe the embodiments of FIGS. 5–7. Specifically signal A is y1; signal B is y2; signal C0 is y3; signal D0 is signal $y_{\overline{x0}}$; and signal D1 is signal $y_{x0}$. Signal OUT2 is signal z. Signal C1 is signal x0.

Thus, with this changed notation, the Shannon decomposition embodiment of FIG. 8B, implements the function z=g(y0,y1,y2,y3); wherein the value of signal y0 depends upon the value of critical path signal x0; and wherein the value of z depends, inter alia, upon the value of y0. Signal OUT0 represents x0 cofactor of z, signal $z_{\overline{x0}}$. Signal OUT1 represents x0-cofactor of z, signal $z_{x0}$. It will be appreciated that using the circuit 800 of FIG. 8B, values for x0-cofactors $y_{\overline{x0}}$ and $y_{x0}$ can be computed by a different LE (not shown) and routed to signals D0 and D1 of the LE 800 prior to the arrival of a value for x0. Moreover, values for signals $z_{x0}$ and $z_{\overline{x0}}$ can be calculated in LE 800 before the arrival of a value of signal x0, and can be provided as data inputs to first-level multiplexer 804. Upon the arrival of a control signal representing a value for critical path signal x0, the appropriate value of z, either $z_{x0}$ or $Z_{\overline{x0}}$ is selected as an output signal of the first-level multiplexer 804.

In more general terms logic circuit 800B is programmed or configured to operate with a layer of interposed multiplexer circuitry 806 is connected between a k-level multiplexer 804 and a k+1 level of multiplexers 802. The second level interposed multiplexers 812-1, 812-2, 814-1, 814-2 generate two copies of output values from the k+1 level multiplexers and distribute a copy to the data inputs of each of the two first level interposed multiplexers 808, 810. Therefore, the first level interposed multiplexers 808, 810 have identical input values.

Therefore, during Shannon decomposition mode operation, corresponding multiplexers within the second interposed level are connected to receive identical data signal inputs and are connected to receive identical control signal inputs. Multiplexers 812-1 and 812-2 are corresponding. Multiplexers 814-1 and 814-2 are corresponding. Consequently, second level interposed multiplexers 812-1, 814-1 provide the same data input signals to first level interposed multiplexer 808, that second level interposed multiplexers 812-2, 814-2 provide to interposed multiplexer 810 first level.

During Shannon decomposition mode operation, the respective first level interposed multiplexers 808, 810 receive cofactors of a critical path dependent signal as respective control inputs. In essence, the first level interposed multiplexers 808, 810 perform the same role that interposed multiplexers 708, 710 perform in the embodiment of FIG. 7. The second level interposed multiplexers 812-1, 812-2, 814-1, 814-2 operate to generate two copies of the four data signals produced by first and second shared LUT blocks 816, 818.

Viewed differently, the operation of the embodiment of FIG. 8B, may be characterized as a two-level decomposition of an output signal z in which LUTs 816-1, 816-2, 818-1, 818-2 are configured to produce two levels of co-factors of output signal z with respect to a critical signal y0 and a non critical signal y1. LUTS 816-1 and 818-1 are configured to produce second-level co-factors $z_{y1,y0}$ and $z_{\overline{y1},y0}$ of output z. LUTs 816-2 and 818-2 are configured to produce second-level co-factors $z_{y1,\overline{y0}}$ and $z_{\overline{y1},\overline{y0}}$ of output z. These second-level co-factors are provided to the interposed layer of multiplex circuitry 806. Values for y1 are provided as control inputs to the interposed layer of multiplex circuitry 806 in order to select between $z_{y1,y0}$ and $z_{\overline{y1},y0}$ to get first-level co-factor $z_{y0}$, and to select between $z_{\overline{y1},y0}$ and $z_{\overline{y1},\overline{y0}}$ to get first-level co-factor $z_{y0}$. Two copies of this co-factors are generated by multiplexers 812-1 and 814-1, and by 812-2 and 814-2, respectively. Subsequent multiplexers controlled by co-factors $y_{x0}$ and $y_{\overline{x0}}$ select between respective pairs of these co-factors to generate co-factors $z_{x0}$ and $z_{\overline{x0}}$. Lastly, the first-level multiplexer 804 controlled by critical path value x0 selects between these two first-level co-factor results $z_{x0}$ and $z_{\overline{x0}}$ to get a value for z.

Persons skilled in the art will appreciate that logic circuit 800 is a versatile device that has non-Shannon modes of operation. Generally speaking, in one non-Shannon mode it can be configured to implement two functions f(A,B,C0,D0) and f(A,B,C1,D1) as OUT0 and OUT 1, respectively. Alternatively, in another non-Shannon mode, it may be configured to implement two distinct functions f(A,C0,D0) and g(B,C1,D1) as OUT0 and OUT1, respectively. These configurations of the logic circuit 800B form no part of the present invention and will be understood by reference to commonly assigned U.S. patent application Ser. No. 10/351,026, entitled Logic Circuitry with Shared Lookup Table, invented by Bruce Pedersen, filed Jan. 24, 2003, and commonly assigned U.S. patent application Ser. No. 10/364,310, entitled, Fracturable Lookup Table and Logic Element, invented by David Lewis, et al. filed Feb. 10, 2003, which are expressly incorporated herein by this reference.

FIG. 9 is a more detailed illustrative drawing of a logic element 900 which includes components that can be used to implement a Shannon decomposition mode of operation. The overall architecture of the LE 900 is described in the above-referenced patent application Ser. No. 10/351,026 and 10/364,310. Therefore, only those components that are new and related to the present invention are described herein. Specifically, during Shannon decomposition mode operation, multiplexers 902-1, 902-2, 904-1 and 904-2 serve as second level interposed multiplexer circuitry; multiplexers 906, 908 serve as first level interposed multiplexer circuitry; and multiplexer M2 serves as a first-level multiplexer.

The LE 900 embodiment of FIG. 9 uses a 6,2 SLM and can implement either two identical functions f(A,B,DC0, DC1,E0,F0) and f(A,B,DC0,DC1,E1,F1), or two independent 5 input functions f(A,B,DC0,E0,F0) and g(A,B,DC1, E1,F1). For the purposes of the Shannon decomposition the LE 900 would be used to implement two copies of a 6 input function f(A,B,DC0,DC1,E0,F0) and f(A,B,DC0,DC1,E0, F1) and an extra multiplexer controlled by E1 is used to select between these two functions. This requires adding multiplexer M2 to the hardware and adding an extra input to multiplexer M1 so that it can select the E0 input to the LE 900 for the second copy of the function f, instead of always using the E1 input.

FIG. 10 shows another alternative embodiment of an LE 1000. Persons skilled in the art will appreciate that the LE 1000 of FIG. 10 is a variation of the LE 900 of FIG. 9. Components of the embodiment of FIGS. 9 and 10 that are identical are identified with identical reference numerals. LE 1000 includes two multiplexers M2' and M3 are included in the LE 1000. These multiplexers allow the LE to perform two stages of 2:1 multiplexers in for use as a barrel shifter, or to select between the outputs of two LEs each performing a 4:1 multiplexer, so as to form an 8:1 multiplexer. This increases the efficiency of constructing multiplexers in LEs.

The multiplexer M3 in FIG. 10 is identical in functionality to the multiplexer M2 in FIG. 9, except for the connectivity of the control input. The control input needs to be connected in a particular manner to allow one half of the LE to perform a 4:1 multiplexer and allow the M2 and M3 multiplexers to perform a 2:1 multiplexing between a pair of 4:1 multiplexers. This requires that the select pin of M2 and M3 not be used as any of the input pins to the 4:1 multiplexers. To extend this LE to be capable of the Shannon logic, it is only necessary to allow the select pin of M3 to drive both halves of the LE. This is performed by adding an input to M1' as shown in FIG. 10. Therefore, in the case of the modified LE 1000, only one extra fanin to multiplexer M1' is required to support the Shannon LE.

It will be understood that the foregoing description and drawings of preferred embodiment in accordance with the present invention are merely illustrative of the principles of this invention, and that various modifications can be made by those skilled in the art without departing from the scope and spirit of the invention.

The invention claimed is:

1. A logic circuit comprising:
    a plurality of logic elements;
    wherein at least one logic element includes,
    first and second LUT blocks that include respective first and second outputs;
    an output multiplexer that includes first and second inputs, an output that includes a control input;
    a control input multiplexer circuit including a control input and including first and second data inputs that can be coupled to receive first and second data outputs provided by one or more other logic elements of the plurality of logic elements and that includes a data output that can be connected to the control input of the output multiplexer;
    multiple control inputs that can be shared by the first and second LUT blocks;
    a critical path signal x provided to the control input of the output multiplexor;
    respective x-cofactors of control signal y as respective data inputs provided to the control input multiplexer circuit;
    non-critical path dependent control signals provided to the multiple respective control inputs; and
    the first and the second LUT blocks programmed to provide respective y-co-factors of an output signal z in response to provision of the non-critical path control signals.

2. The logic circuit of claim 1,
    wherein the first and second LUT blocks are programmed to produce co-factors of a prescribed signal provided on an output of the output multiplexer when the multiple control inputs are connected to be shared by the first and second LUT blocks.

3. The logic circuit of claim 1,
    wherein another logic element of the plurality of logic elements is programmed to produce the respective co-factors of a control signal provided on the output of the control multiplexer; and
    wherein the first and second data inputs of the control multiplexer are coupled to receive the respective control signal co-factors.

4. The logic circuit of claim 1,
    wherein another logic element of the plurality of logic elements is programmed to produce the respective co-factors of a control signal provided on the output of the control multiplexer;
    wherein the first and second data inputs of the control multiplexer are coupled to receive the respective control signal co-factors; and
    wherein the first and second LUT blocks are programmed to produce co-factors of a prescribed output signal provided on an output of the output multiplexer when the multiple control inputs are connected to be shared by the first and second LUT blocks.

5. A logic circuit comprising:
    a plurality of logic elements;
    wherein at least one logic element includes,
    a plurality of memory elements;
    a plurality of multiplexers arranged in a plurality of levels including a highest multiplexer level, which includes a plurality of multiplexers with inputs connected to the memory elements and outputs connected to inputs of multiplexers of a next-to-highest multiplexer level and a first multiplexer level, which includes a k level multiplexer with inputs connected to outputs of multiplexer of a k+1 multiplexer level and at least one output;
    a plurality of respective control inputs that can be connected to the respective multiplexers of the plurality of multiplexers; and
    a control input multiplexer circuit including a control input and including first and second data inputs that can be configured to receive first and second data outputs provided by one or more other logic elements of the plurality of logic elements and that includes a data output that can be connected to a control input of the k level multiplexer of the plurality of multiplexers;
    a critical path signal x provided to control the input multiplexer circuit;
    x co-factors of signal y as data inputs provided to the control input multiplexer circuit; and
    non-critical path control signals provided to the plurality of respective control inputs.

6. The logic circuit of claim 5,
    wherein the plurality of multiplexers are arranged to form a first look-up table that provides a first k+1 level output and to provide a second look-up table that provides a second k+1 level output; and
    wherein the first and second look-up tables can share the plurality of respective control inputs.

7. The logic circuit of claim 5,
wherein the plurality of multiplexers are arranged to form a first look-up table that provides a first k+1 level output and to provide a second look-up table that provides a second k+1 level output; and
wherein the first and second look-up tables can share the plurality of respective control inputs; and
wherein the k level multiplexer is a first level multiplexer and the k+1 level multiplexers are second level multiplexers.

8. The logic circuit of claim 5 comprising:
the memory elements programmed to cause k+1 level multiplexers of the plurality of multiplexers to produce y-co-factors of a signal z in response to provision of the non-critical path control signals.

9. A logic circuit comprising:
a plurality of logic elements;
wherein a first logic element of the plurality of logic elements includes,
a plurality of memory elements;
a plurality of multiplexers arranged in a plurality of levels including a highest multiplexer level, which includes a plurality of multiplexers with inputs connected to the memory elements and outputs connected to inputs of multiplexers of a next-to-highest multiplexer level and a first multiplexer level, which includes a k level multiplexer with inputs connected to outputs of multiplexers of a k+1 multiplexer level and at least one output; and
a plurality of respective control inputs that can be connected to the respective multiplexers of the plurality of multiplexers; and
a control input multiplexer circuit including a control input and including first and second data inputs that can be configured to receive first and second data outputs provided by one or more other logic elements of the plurality of logic elements and that includes a data output that can be connected to a control input of the k level multiplexer of the plurality of multiplexers;
wherein the control input multiplexer circuit is coupled to receive a first critical path signal x;
wherein respective data inputs to the control put multiplexer circuit are coupled to receive respective x-co-factors of a signal y;
wherein the plurality of multiplexers are arranged to form a first look-up table that provides a first k+1 level output and to provide a second look-up table that provides a second k+1 level output;
wherein the first and second look-up tables share the respective plurality of control inputs; and
wherein the memory elements are programmed to cause the respective first and second look-up tables to produce respective y-co-factors of a signal z on the first and second k+1 level outputs in response to provision of the control signals provided to the shared plurality of control inputs.

10. The logic circuit of claim 9,
wherein another logic element of the plurality of logic elements is programmed to produce the respective x-co-factors of signal y.

11. A logic circuit comprising:
a first LUT block that includes first LUT block output;
a second LUT block that includes second LUT block output;
an output multiplexer that includes fist and second data inputs, a data output and a control input;
a first interposed multiplexer that can be coupled to receive signals output by the respective fist and second outputs of the first and second LUT blocks and that includes a first intermediate multiplexer output that can be coupled to the first input of the output multiplexer and that includes a control input;
a second interposed multiplexer that can be coupled to receive signals output by the respective first and second outputs of the first and second LUT blocks and that includes a second intermediate multiplexer output that can be coupled to the second input of the output multiplexer and that includes a control input;
respective control inputs that can be shared by the first and second LUT blocks;
a critical path signal x provided to the control input of the output multiplexer;
respective x-c-factors of control signal y provided to respective control inputs of the first and second interposed multiplexers;
respective non-critical path dependent control signals provided to the respective control inputs; and
the first and second LUT blocks programmed to provide respective y-co-factors of an output signal z on respective first and second LUT block outputs in response to provision of the respective non-critical path control signals.

12. The logic circuit of claim 11,
wherein the first and second LUT blocks can be programmed to produce co-factors when the respective control inputs are connected to be shared by the first and second LUT blocks.

13. A logic circuit comprising:
a first LUT block that includes a first LUT block output;
a second LUT block that includes a second LUT block output;
a third LUT block that includes a third LUT block output;
a fourth LUT block that includes a fourth LUT block output;
an output multiplexer that includes first and second data inputs and first, a data output and a control input;
respective control inputs that can be shared by the first through fourth LUT blocks;
interposed means for receiving respective first, second, third and fourth LUT block output signals and for receiving first and second control signals and for providing a first intermediate output signal to the first data input of the output multiplexer and for receiving third and fourth input signals providing a second intermediate output signal to the second data input of the output multiplexer;
a critical path signal x provided to a control input of the at least one k level multiplexer;
respective x-co-factors of a critical path signal dependent control signal y provided to respective control inputs of the first and second interposed multiplexers; and
non-critical path dependent control signals provided as control input signals to one or more other control inputs of the plurality of multiplexers.

14. The logic circuit apparatus of claim 13 comprising:
the first and third LUT blocks programmed to provide respective $z_{y_1 y_0}$ and $z_{\overline{y_1} y_0}$ second-level co-factor outputs of an output signal z on respective first and third LUT block outputs in response to provision of the respective non-critical path control signals; and
the second and fourth LUT blocks programmed to provide respective $z_{y_1 \overline{y_0}}$ and $z_{\overline{y_1} \overline{y_0}}$ second-level co-factor outputs of the output signal z on respective second and fourth LUT block outputs in response to provision of the respective non-critical path control signals; and a non-critical input signal provided to the first and third control inputs of the interposed means;

co-factors $y_{\bar{x}0}$ and $y_{x0}$ provided to the second and fourth control inputs of the interposed means;

the interposed means providing one of the first and third LUT block outputs or one of the second and fourth LUT block outputs to the first data input of the output multiplexer in response to the first control signal and second control signals; and the interposed means providing one of the first and third LUT block outputs or one of the second and fourth LUT block outputs to the second data input of the output multiplexer in response to the third and fourth control signals.

15. A logic circuit comprising:

a plurality of memory elements;

a plurality of multiplexers arranged in a plurality of levels including a highest multiplexer level, which includes a plurality of multiplexers with inputs connected to the memory elements and outputs connected to inputs of multiplexers of a next-to-highest multiplexer level and a first multiplexer level, which includes at least one multiplexer in a first level with inputs connected to outputs of multiplexers of a second multiplexer level and at least one output; and at least one interposed level of multiplexers; and wherein the at least one interposed level of multiplexers can be connected between k+1 level multiplexers and at least one k level multiplexer of the plurality of multiplexers;

respective control inputs can be connected to the respective multiplexers of levels k+1 or higher;

wherein the at least one interposed level of multiplexers includes first interposed multiplex circuitry and second interposed multiplex circuitry that can be connected to receive identical data input signals provided as data output signals of the k+1 level multiplexers; and wherein the first interposed multiplex circuitry and the second interposed multiplex circuitry can be connected to first and second data inputs of the at least one k level multiplexer;

a critical path signal x provided to a control input of the at least one k level multiplexer;

respective x-co-factors of a critical path signal dependent control signal y provided to respective control inputs of the first and second interposed multiplexers; and non-critical path dependent control signals provided as control input signals to one or more other control inputs of the plurality of multiplexers.

16. The logic circuit of claim 15, wherein the plurality of multiplexers are arranged to include two first look-up tables that provides two fist k+1 level outputs and to include two second look-up tables that provide two second k+1 level outputs; and wherein the two first and two second look-up tables can share the control inputs.

17. The logic circuit of claim 15, wherein the plurality of multiplexers are arranged to include two first look-up tables that provides two first k+1 level outputs and to include two second look-up tables that provide two second k+1 level outputs;

wherein the two first and two second look-up tables can share the control inputs; and wherein the k level multiplexer is a first level multiplexer and the k+1 level multiplexers are second level multiplexers.

18. The logic circuit apparatus of claim 15 comprising:

a critical path signal x provided to a control input of the at least one k level multiplexer;

respective x-co-factors of a first critical path signal dependent signal y provided to respective control inputs of the first and second interposed multiplexers;

non-critical path dependent control signals provided to one or more other control inputs of the plurality of multiplexers; and the memory elements to cause the k+1 level multiplexers programmed to produce at y-co-factors of a second critical path signal dependent signal z in response to provision of the non-critical path control signals.

19. A programmable logic device comprising:

a first logic element including a look up table programmed to produce a $y_{\bar{x}0}=f(0,x1,x2,\ldots)$ value and a $y_{x0}=f(1,x1,x2,\ldots)$ value;

a second logic element including a look up table programmed to produce a $z_{\bar{y}0}=g(0,y1,y2,\ldots)$ value and a $z_{y0}=g(1,y1,y2,\ldots)$ value;

a first multiplexer circuit in the second logic element coupled to receive the $z_{\bar{y}0}$ value as a data input and coupled to receive the $z_{y0}$ value as a data input and coupled to receive the $y_{\bar{x}0}$ value as a control input, wherein the first multiplexer circuit provides as an output one of a $z_{\bar{y}0}$ received value or a received $z_{y0}$ value in response to a received $y_{\bar{x}0}$ value;

a second multiplexer circuit in the second logic element coupled to receive the $z_{\bar{y}0}$ value as a data input and coupled to receive the $z_{y0}$ value as a data input and coupled to receive the $y_0$ value as a control input, wherein the second multiplexer circuit provides as an output the other a received $z_{\bar{y}0}$ value or a received $z_{y0}$ value in response to a received $y_{x0}$ value; and a third multiplexer circuit in the second logic-element coupled to receive an output of the first multiplexer circuit as a data input and coupled to receive an output of the second multiplexer circuit as a data input and coupled to receive an x0 value as a control input, wherein the third multiplexer circuit provides as an output one of a received output of the first multiplexer or a received output of the second multiplexer in response to a received x0 value.

* * * * *